(12) United States Patent
Lin et al.

(10) Patent No.: US 11,056,419 B2
(45) Date of Patent: Jul. 6, 2021

(54) SEMICONDUCTOR DEVICE HAVING BACKSIDE INTERCONNECT STRUCTURE ON THROUGH SUBSTRATE VIA AND METHOD OF FORMING THE SAME

(71) Applicant: Taiwan Semiconductor Manufacturing Company, Ltd., Hsinchu (TW)

(72) Inventors: Yung-Chi Lin, Su-Lin (TW); Hsin-Yu Chen, Taipei (TW); Ming-Tsu Chung, Hsinchu (TW); HsiaoYun Lo, Hsinchu (TW); Hong-Ye Shih, New Taipei (TW); Chia-Yin Chen, Hsinchu (TW); Ku-Feng Yang, Baoshan Township (TW); Tsang-Jiuh Wu, Hsinchu (TW); Wen-Chih Chiou, Zhunan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/570,777

(22) Filed: Sep. 13, 2019

(65) Prior Publication Data

US 2020/0006201 A1 Jan. 2, 2020

Related U.S. Application Data

(62) Division of application No. 15/269,753, filed on Sep. 19, 2016, now Pat. No. 10,510,641, which is a
(Continued)

(51) Int. Cl.
*H01L 23/48* (2006.01)
*H01L 21/768* (2006.01)

(52) U.S. Cl.
CPC ...... *H01L 23/481* (2013.01); *H01L 21/76841* (2013.01); *H01L 21/76883* (2013.01); *H01L 21/76898* (2013.01); *H01L 2924/0002* (2013.01)

(58) Field of Classification Search
CPC ......... H01L 21/76801–76814; H01L 45/1683; H01L 2221/10–1089; H01L 2224/05006–05093; H01L 2224/05546; H01L 21/02063; H01L 21/486; H01L 21/76877–76898; H01L 21/76897; H01L 23/481–4855; H01L 23/5226; H01L 23/5384; H01L 2225/06541–06548; H01L 23/49827
See application file for complete search history.

(56) References Cited

U.S. PATENT DOCUMENTS

| 5,731,225 A | 3/1998 | Yamamori |
| 2005/0136634 A1 | 6/2005 | Savastiouk et al. |

(Continued)

*Primary Examiner* — Cuong B Nguyen
(74) *Attorney, Agent, or Firm* — Slater Matsil, LLP

(57) ABSTRACT

A semiconductor device includes a through-substrate via extending from a frontside to a backside of a semiconductor substrate. The through-substrate via includes a concave or a convex portion adjacent to the backside of the semiconductor substrate. An isolation film is formed on the backside of the semiconductor substrate. A conductive layer includes a first portion formed on the concave or convex portion of the through substrate via and a second portion formed on the isolation film. A passivation layer partially covers the conductive layer.

19 Claims, 9 Drawing Sheets

Related U.S. Application Data division of application No. 13/955,688, filed on Jul. 31, 2013, now Pat. No. 9,449,898.

(56) References Cited

U.S. PATENT DOCUMENTS

| | | |
|---|---|---|
| 2006/0097357 A1 | 5/2006 | Nemoto |
| 2009/0305502 A1 | 12/2009 | Lee et al. |
| 2010/0090317 A1 | 4/2010 | Zimmermann et al. |
| 2010/0167534 A1 | 7/2010 | Iwata |
| 2011/0095373 A1 | 4/2011 | Hwang et al. |
| 2011/0133333 A1* | 6/2011 | Kwon .................... H01L 24/11 257/737 |
| 2012/0056315 A1 | 3/2012 | Chang et al. |
| 2012/0074584 A1 | 3/2012 | Lee et al. |
| 2012/0193778 A1 | 8/2012 | Mawatari |
| 2012/0235305 A1* | 9/2012 | Kim .................... H01L 23/3128 257/774 |
| 2013/0210222 A1 | 8/2013 | Lee et al. |
| 2014/0162449 A1 | 6/2014 | An et al. |
| 2014/0235052 A1* | 8/2014 | Park ................. H01L 21/76873 438/653 |

* cited by examiner

US 11,056,419 B2

SEMICONDUCTOR DEVICE HAVING BACKSIDE INTERCONNECT STRUCTURE ON THROUGH SUBSTRATE VIA AND METHOD OF FORMING THE SAME

PRIORITY CLAIM AND CROSS-REFERENCE

This application is a division of U.S. patent application Ser. No. 15/269,753, filed on Sep. 19, 2016, and entitled "Semiconductor Device Having Backside Interconnect Structure on Through Substrate Via and Method of Forming the Same" which claims the benefit to and is a divisional of U.S. patent application Ser. No. 13/955,688, filed on Jul. 31, 2013, now U.S. Pat. No. 9,449,898 issued on Sep. 20, 2016, and entitled "Semiconductor Device Having Backside Interconnect Structure on Through Substrate Via and Method of Forming the Same," which applications are incorporated herein by reference.

BACKGROUND

The semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more components to be integrated into a given area. These integration improvements are essentially two-dimensional (2D) in nature, in that the volume occupied by the integrated components is essentially on the surface of the semiconductor wafer. Although dramatic improvements in lithography have resulted in considerable improvement in 2D IC formation, there are physical limits to the density that can be achieved in two dimensions. One of these limits is the minimum size needed to make these components. Also, when more devices are put into one chip, more complex designs are required.

In an attempt to further increase circuit density, three-dimensional (3D) ICs have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate. This attempt, however, requires a carrier substrate larger than the dies for the wire bonding. More recent attempts have focused on through-substrate vias (TSVs). Generally, the TSV is formed by etching a vertical opening through a substrate and filling the opening with a conductive material, such as copper. The backside of the substrate is thinned to expose the TSVs, and another die is bonded to the exposed TSVs, thereby forming a stacked-die package.

DETAILED DESCRIPTION

Figure 1:
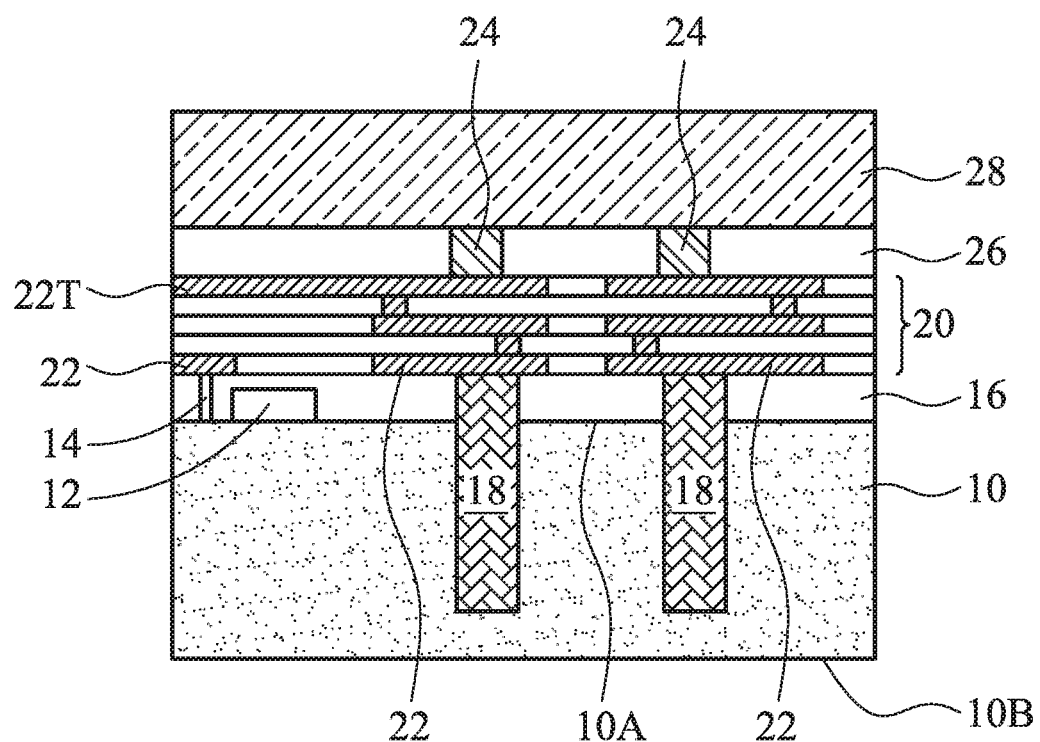
FIGS. 1-9 are cross-sectional views illustrating intermediate stages of a method for forming a semiconductor device with a backside interconnect structure on a through substrate via with a concave surface according to some embodiments.

It is to be understood that the following disclosure provides many different embodiments or examples, for implementing different features of various embodiments. Specific examples of components and arrangements are described below to simplify the present disclosure. The present disclosure may, however, be embodied in many different forms and should not be construed as being limited to the embodiments set forth herein; rather, these embodiments are provided so that this description will be thorough and complete, and will fully convey the present disclosure to those of ordinary skill in the art. It will be apparent, however, that one or more embodiments may be practiced without these specific details.

In the drawings, the thickness and width of layers and regions are exaggerated for clarity. Like reference numerals in the drawings denote like elements. The elements and regions illustrated in the figures are schematic in nature, and thus relative sizes or intervals illustrated in the figures are not intended to limit the scope of the present disclosure.

FIGS. 1-9 are cross-sectional views illustrating intermediate stages of a method for forming a semiconductor device with a backside interconnect structure on a through substrate via according to some embodiments.

Referring to FIG. 1, a semiconductor substrate 10 has electrical circuitry 12 formed thereon. The semiconductor substrate 10 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used. The electrical circuitry 12 formed on the semiconductor substrate 10 may be any type of circuitry suitable for a particular application. In an embodiment, the circuitry includes electrical devices formed on the substrate with one or more dielectric layers overlying the electrical devices. Metal layers may be formed between dielectric layers to route electrical signals between the electrical devices. Electrical devices may also be formed in one or more dielectric layers. For example, the electrical circuitry 12 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. The above examples are provided for illustrative purposes only to further explain illustrative applications and are not meant to limit other embodiments in any manner. Other circuitry may be used as appropriate for a given application.

Also shown in FIG. 1, contacts 14 are formed through an inter-layer dielectric (ILD) layer 16 to provide an electrical contact to the electrical circuitry 12. The ILD layer 16 may be formed, for example, of a low-K dielectric material, such as silicon oxide, phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method known in the art, such as spinning, CVD, and PECVD. In some embodiments, the ILD layer 16 includes a plurality of dielectric layers, with or without an etch stop layer formed between adjacent dielectric layers. The contacts 14 may be formed, for example, by using photolithography techniques to deposit and pattern a photoresist material on the ILD layer 16 to expose portions of the ILD layer 16 that are to become the contacts 14. An etch process, such as an anisotropic dry etch process, may be used to create openings in the ILD layer 16. The openings may be lined with a diffusion barrier layer and/or an adhesion layer (not shown), and filled with a conductive material. The diffusion barrier layer may comprise one or more layers of TaN, Ta, TiN, Ti, CoW, or the like, and the conductive material may comprise copper, tungsten, aluminum, silver, and combinations thereof, or the like, thereby forming the contacts 18.

In accordance with an embodiment, through-substrate via (TSV) structures 18 are formed in the semiconductor substrate 10. The TSV structures 18 are conductive vias extending from the frontside 10A into a depth of the semiconductor substrate 10. The TSV structures 18 may be formed by any appropriate method. For example, openings may be formed extending into the semiconductor substrate 110 after forming the ILD layer 16 by, for example, one or more etching processes, milling, laser techniques, or the like. The openings are lined with a liner, acting as an isolation layer, and filled with a conductive material. The liner may comprise one or more dielectric layers such as silicon oxide, silicon nitride, oxynitride, polymer, a combination thereof, or the like, and the conductive material may comprise one or more layers of a conductive material such as copper, copper alloy, tungsten, tungsten alloy, aluminum, silver, combinations thereof, or the like, thereby forming the TSV structures 18. Other materials, including conductive diffusion barrier layers, such as TaN, Ta, TiN, Ti, CoW, or the like, may also be used between the liner and the conductive material. It should be noted that the TSV structures 18 are illustrated as extending in the semiconductor substrate 10 from a top surface of the ILD layer 16 for illustrative purposes only and that other arrangements may be utilized. For example, in another embodiment the TSV structures 18 may extend from a top surface at the frontside 10A of the semiconductor substrate 110. For example, in an embodiment, the TSV structures 18 are formed by creating openings extending into the semiconductor substrate 10 after forming the contacts 14.

One or more inter-metal dielectric (IMD) layers 20 and the associated metallization layers 22 are formed over the ILD layer 16. In some embodiments, the one or more IMD layers 20 and the associated metallization layers 22 are used to interconnect the electrical circuitry to each other and to provide an external electrical connection. In an embodiment, the metallization layers 22 are used to electrically connect to the TSVs 18 and the electrical circuitry 12. In an embodiment, the IMD layers 20 includes at least one, and possibly a plurality of, low-k dielectric layer(s) having low dielectric constant (k) values. The k values of the low-k dielectric materials in the dielectric layer 22 may be lower than about 3.0, or lower than about 2.5, for example. The IMD layers 20 may be formed of a suitable dielectric material formed by PECVD techniques or high-density plasma chemical vapor deposition (HDPCVD), or the like, and may include intermediate etch stop layers. Top metal contacts 22T are provided in the uppermost IMD layer 20 to provide external electrical connections. Conductive bumps 24, such as metal bumps formed including Cu, Cu alloy, W, W alloy, silver, CuSn, AuSn, InAu, PbSn, AgSn, or the like, are formed on the top metal contacts 22T, and a carrier substrate 28 is attached to the semiconductor substrate 10 using an adhesive layer 26. In some embodiments, the carrier substrate 28 provides temporary mechanical and structural support during subsequent processing steps. The carrier substrate 28 may comprise, for example, glass, silicon oxide, aluminum oxide, and the like. The adhesive layer 26 may be any suitable adhesive, such as ultraviolet (UV) glue, which loses its adhesive property when exposed to UV lights.

Figure 2:
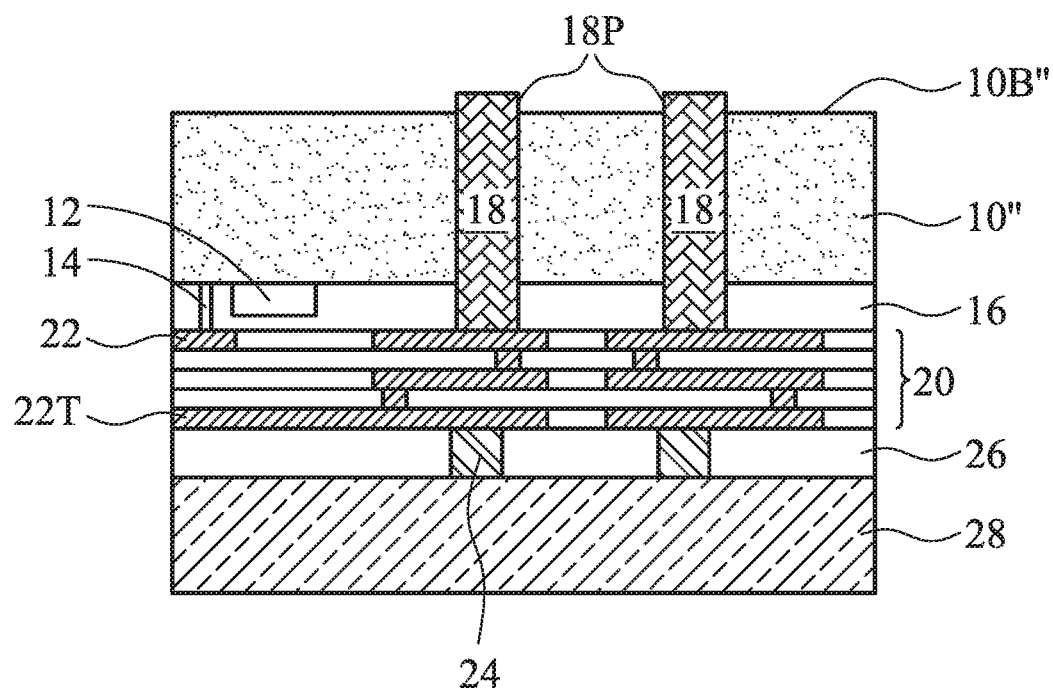

FIG. 2 illustrates a thinning process performed on a backside 10B of the semiconductor substrate 10 to expose the TSV structures 18 in accordance with an embodiment. The thinning process may be performed using a mechanical grinding process, a chemical mechanical polishing (CMP) process, an etching process, and/or a combination thereof. For example, initially a planarizing process, such as grinding or a CMP, may be performed to initially expose the TSV structures 18. Thereafter, a wet or dry etching process having a high etch-rate selectivity between the TSV structures 18 and the material of the semiconductor substrate 10 may be performed to recess the semiconductor substrate 10, thereby leaving the TSV structures 18 protruding from the backside 10B" of the thinned semiconductor substrate 10" (portions 18P).

Figure 3:
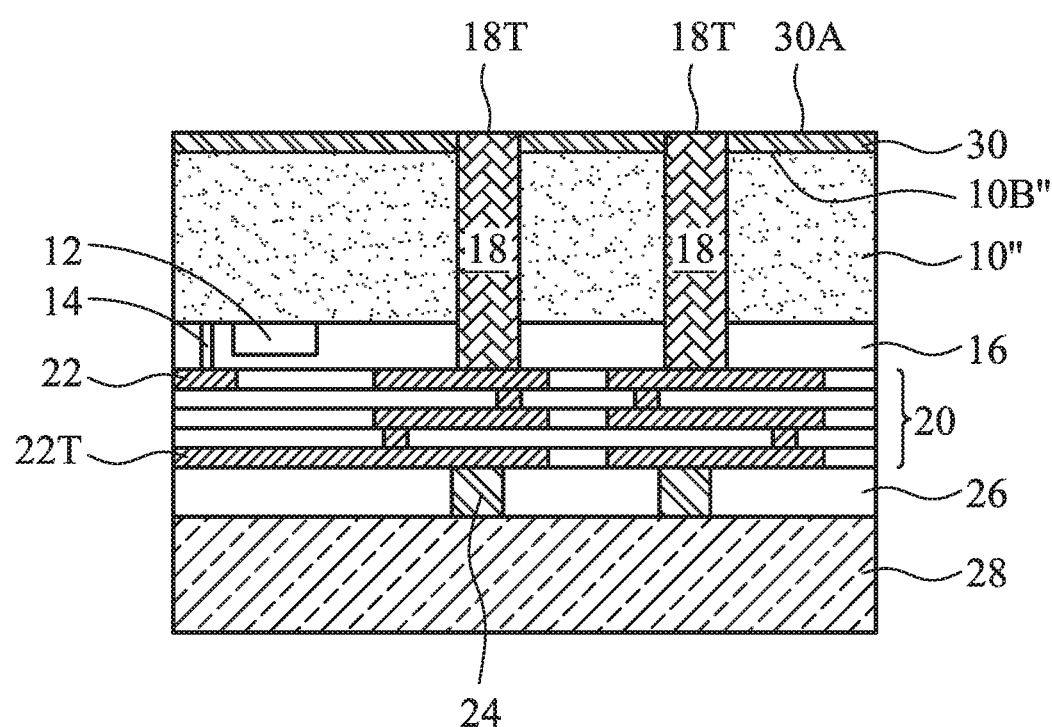

Next, as shown in FIG. 3, an isolation film 30 is formed over the backside 10B" of the thinned semiconductor substrate 10" to cover the protruding portions of the TSV structures 18. In an embodiment, the isolation film 30 is a dielectric material, such as SiN, an oxide, SiC, SiON, a polymer, or the like, and may be formed by, for example, spin-coating, printing, a CVD process, or the like. An etching process (wet or dry etching) or a planarization process (grinding or a CMP) may be further utilized to expose the top surfaces 18T of the protruding portions 18P of the TSV structures 18. In an embodiment, the top surface 18T is substantially level with the top surface 30A of isolation film 30.

Figure 4:
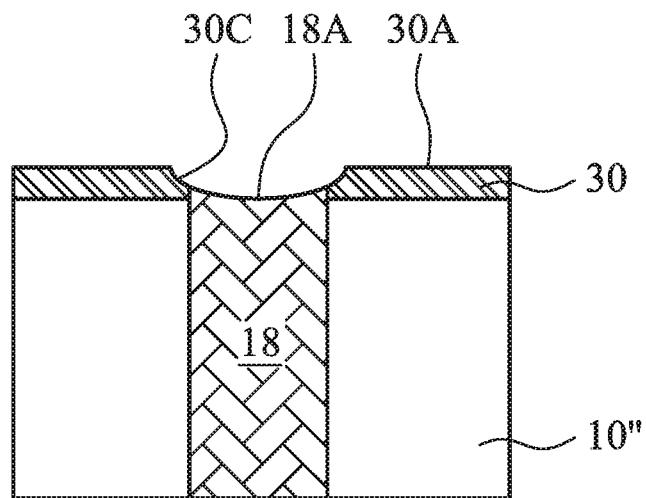

Referring to FIG. 4, an etching process is performed to recess the top surface 18T of the TSV structure 18, and thereby the top surface 18T becomes a concave surface 18A. The concave surface 18A is lower than the top surface 30A of the isolation film 30. In an embodiment, the TSV structure 18 can be recessed by, for example, performing a dry etch process using $HBr/O_2$, $HBr/Cl_2/O_2$, $SF_6/CL_2$, $SF_6$ plasma, or the like. In an embodiment, the distance between the concave surface 18A and the top surface 30A is in the range of about 1000 Å to about 2 μm. In some embodiments, at this step, a portion of the isolation film 30 adjacent to the concave surface 18A is etched as a curved surface 30C.

Figure 5:
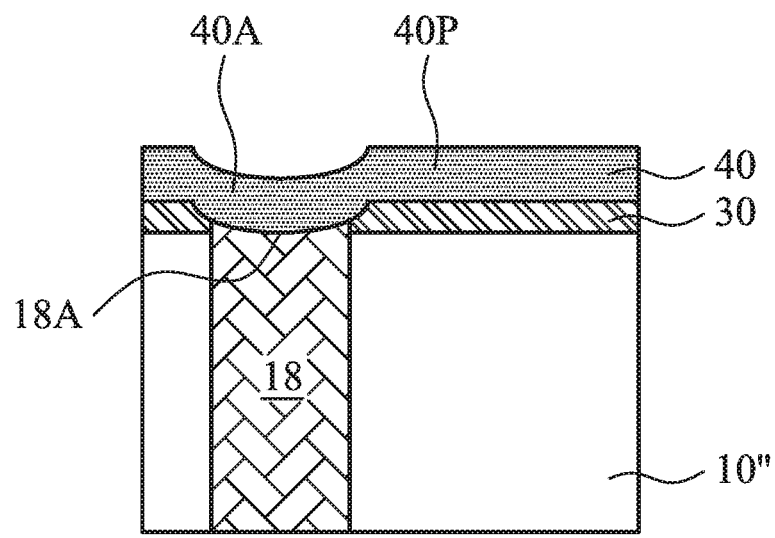

Referring now to FIG. 5, a conductive layer 40 is deposited over the isolation film 30 and the TSV structure 18. In an embodiment, the conductive layer 40 is formed by depositing a conformal conductive layer, such as a layer of Al, an Al alloy, W, Cu, Ti, Ta, TiN, TaN, or the like, using CVD or PVD techniques. When the conductive layer 40 is deposited, it replicates the topography of the underlying feature, and thereby a concave portion 40A is formed in the conductive layer 40 and positioned in accordance with the concave surface 18A of the TSV structure 18. The conductive layer 40 also includes a planar portion 40P positioned in accordance with the top surface 30A of the isolation film 30. The concave portion 4A is lower than the surface of the planar portion 40P.

Figure 6:
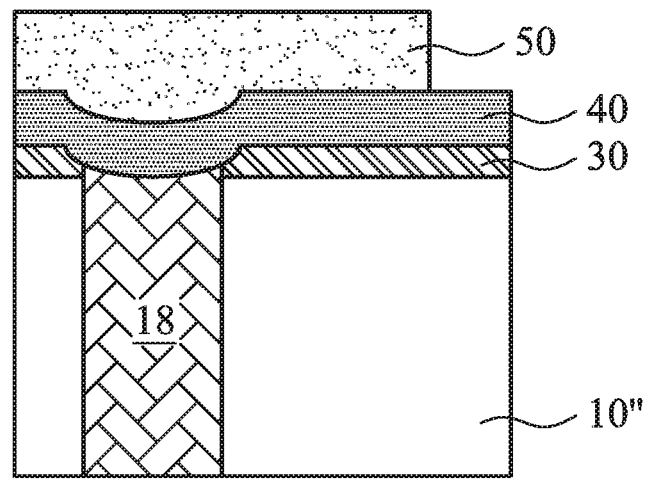

FIG. 6 illustrates a patterned mask 50 formed over the conductive layer 40 in accordance with an embodiment. The patterned mask 50 defines portions of the conductive layer 40 that will act as conductive pads and/or redistribution lines. The patterned mask 50 may be a patterned photoresist mask, hard mask, a combination thereof, or the like. In an embodiment, a photoresist material is deposited on the conductive layer 40 and patterned using photolithographic techniques. To locate the photoresist pattern accurately, a target location is acquired when light sources are utilized to detect and read reflection signals from the material layer underlying the photoresist material. By using the recessed TSV structure 18 as an alignment target, returned signals reflected from the concave portion 40A and the planar portion 40P are read and detected, and the step height is easily aligned by lithographic tools such that the photoresist material can be patterned and located accurately in the photolithography process.

Figure 7:
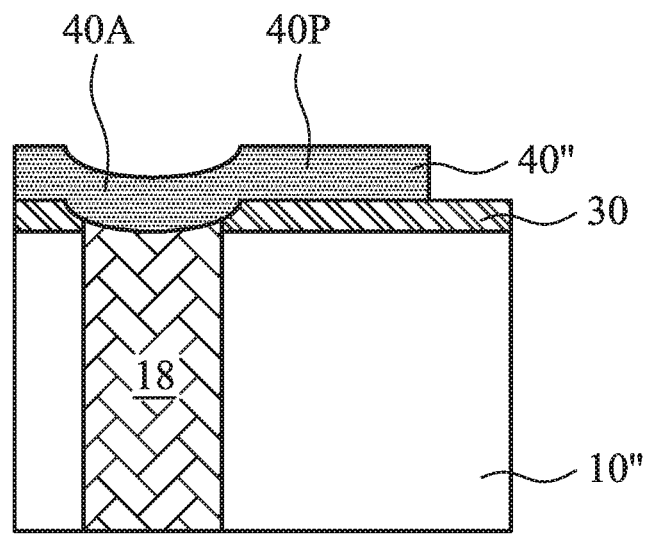

Thereafter, as shown in FIG. 7, an etch process is performed to pattern the conductive layer 40 to form conductive elements 40" that act as the conductive pads and/or redistribution lines. The etch process may be, for example, a wet or dry etch process. For example, in an embodiment in which the conductive layer 40 is formed of Al, the etch process may be performed using $Cl_2$ and $BCl_3$. After the etch process, the patterned mask 50 may be stripped by, for example, an ashing process, such as a plasma ashing process using $O_2$ or another stripping process, and a cleaning process, such as a wet dip in dilute hydrofluoric acid or an organic chemical may be performed to remove any contaminants from the surface of the conductive elements 40" and the isolation film 30. In an embodiment, the conductive element 40" physically contacts and electrically connects the TSV structure 18 and includes the concave portion 40A located above the concave surface 18A of the TSV structure 18. In some embodiments, the conductive element 40" also includes the planar portion 40P that extends from the concave portion 40A and physically contacts the top surface 30A of the isolation film 30. The conductive element 40" may act as a redistribution layer to provide an electrical connection to the TSV structure 18 and to provide redistribution lines. The conductive element 40" may act as a redistribution line which allows an electrical connection to another device, such as a die, wafer, packaging substrate, or the like, at a location other than the location of the TSV structure 18. This allows for greater flexibility and a higher degree of independence regarding the placement of the TSV structures 18, the electrical circuitry on the substrate, and the pin-out locations.

Figure 8:
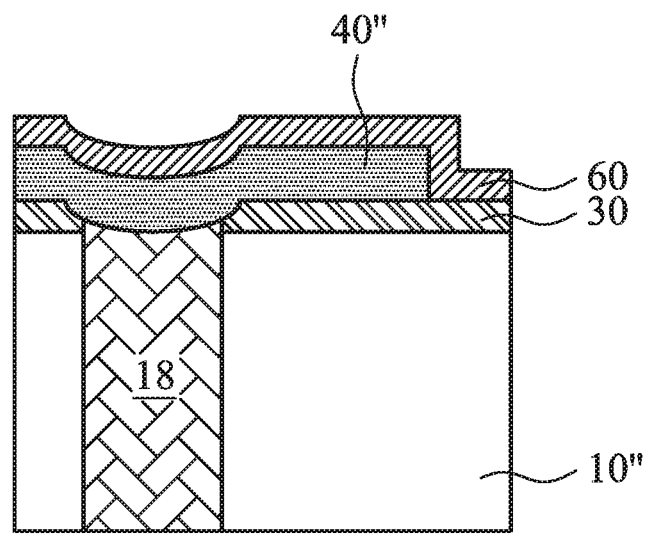
Figure 9:
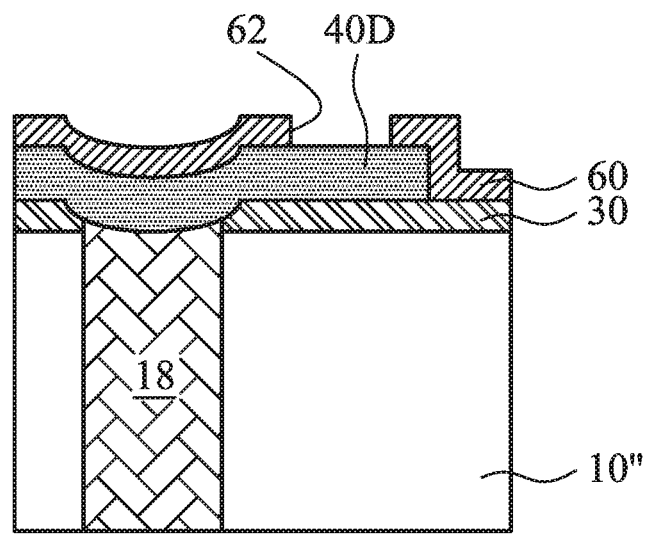

FIG. 8 illustrates a passivation layer 60 formed over the conductive element 40" and the isolation film 30 in accordance with an embodiment. The passivation layer 60 is a dielectric material, such as SiN, an oxide, SiC, SiON, a polymer, SOG, combinations thereof, or the like, and may be formed by, for example, spin-coating, printing, a CVD process, or the like. The passivation layer 60 is formed of a thickness sufficient to cover the conductive elements 40". Next, as shown in FIG. 9, the passivation layer 60 is patterned by using photoresist material, photolithographic techniques and an etch process, and the photoresist material is stripped after the etch process. In an embodiment, the patterned passivation layer 60 includes a contact opening 62 exposing a portion 40D of the conductive element 40". A connection element can be formed on the exposed portion 40D in accordance with an embodiment. The connection element may be any suitable conductive material, such as Cu, Ni, Sn, Au, Ag, solder or the like, and may be formed by any suitable method, including evaporation, electroplating, printing, jetting, stud bumping, direct placement, wire bonding or the like. Thereafter, other back-end-of-line processing techniques suitable for the particular application may be performed. For example, the carrier substrate 28 may be removed, an encapsulant may be formed, a singulation process may be performed to singulate individual dies, wafer-level or die-level stacking, and the like, may be performed. It should be noted, however, that embodiments may be used in many different situations. For example, embodiments may be used in a die-to-die bonding configuration, a die-to-wafer bonding configuration, or a wafer-to-wafer bonding configuration.

FIGS. 10-16 are cross-sectional views illustrating intermediate stages of another method for forming a semiconductor device with a backside interconnect structure on a through substrate via according to some embodiments. Unless specified otherwise, the reference numerals in these embodiments represent like elements in the embodiments illustrated in FIGS. 1-9.

Figure 10:
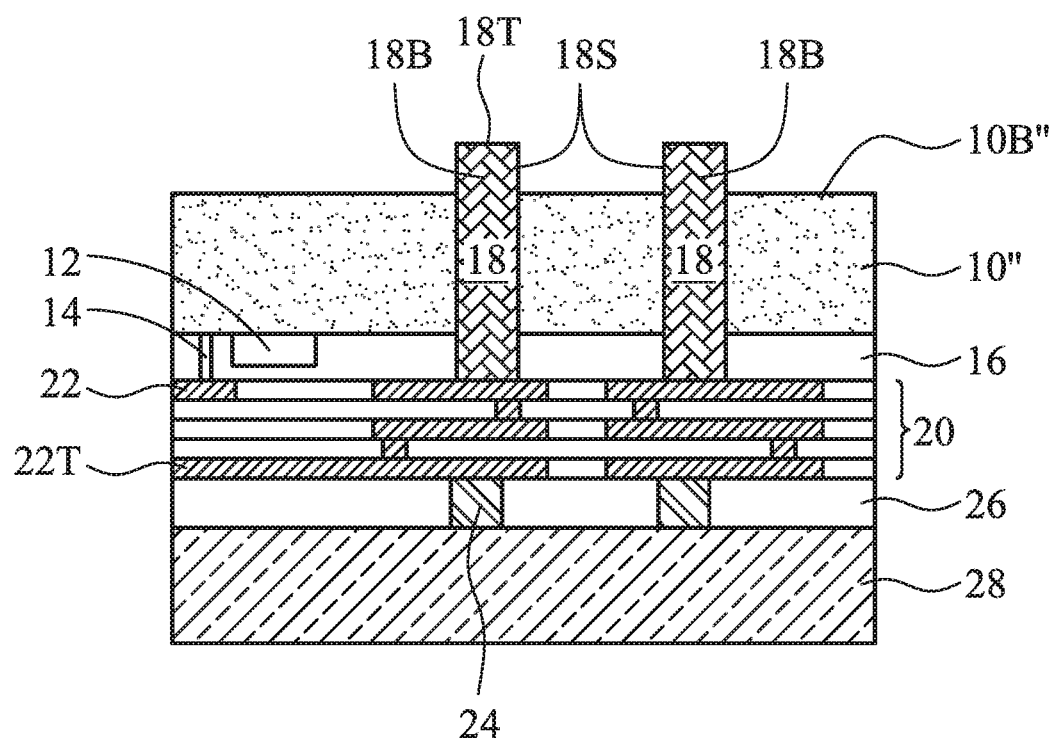
FIGS. 10-16 are cross-sectional views illustrating intermediate stages of another method for forming a semiconductor device with a backside interconnect structure on a through substrate via with a convex portion according to some embodiments.

Referring to FIG. 10, a thinning process performed on a backside 10B of the semiconductor substrate 10 to expose the TSV structures 18 in accordance with an embodiment. The thinning process may be performed using a mechanical grinding process, a chemical mechanical polishing (CMP) process, an etching process, and/or a combination thereof. For example, initially a planarizing process, such as grinding or a CMP, may be performed to initially expose the TSV structures 18. Thereafter, a wet or dry etching process having a high etch-rate selectivity between the TSV structures 18 and the material of the semiconductor substrate 10 may be performed to recess the semiconductor substrate 10, thereby forming a convex portion 18B of the TSV structures 18 protruding from the backside 10B" of the thinned semiconductor substrate 10". In an embodiment, the distance between the top of convex portion 18B and the top surface of backside 10B" is in the range of about 1000 Å to about 2 μm.

Figure 11:
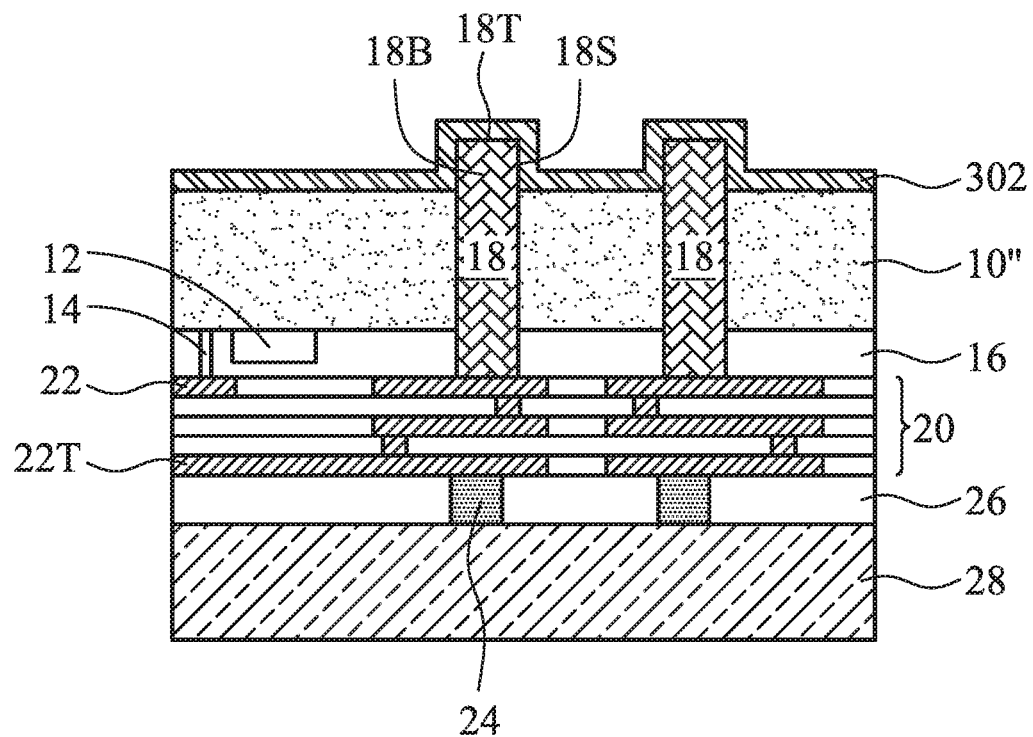
Figure 12:
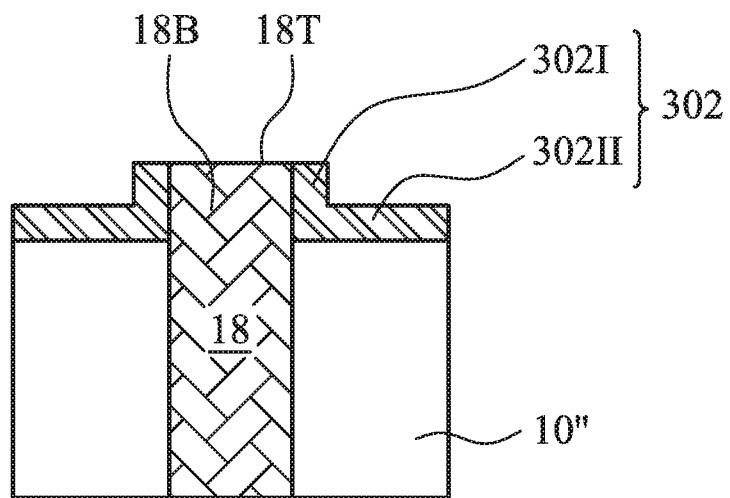

Thereafter, as illustrated in FIG. 11, an isolation film 302 is formed to cover the backside 10B" of the thinned semiconductor substrate 10" and the convex portions 18B of the TSV structures 18. The isolation film 302 is a conformal film formed using similar processes and materials as the isolation film 30 discussed above with reference to FIG. 3. In an embodiment, the isolation film 302 covers the top 18T and sidewalls 18S of the convex portion 18B. Then an etching process (wet or dry etching) or a planarization process (grinding or a CMP) is utilized to remove the isolation film 302 from the top surfaces 18T of the protruding portions of the TSV structures 18 as shown in FIG. 12. Thereby the top surface 18T is exposed again, a first portion 302I of the isolation film 302 is left on the sidewall 18S of the convex portion 18B, and a second portion 302II of the isolation film 302 is left on the backside 10B" of the thinned semiconductor substrate 10", and. There is a step height between the top surface 18 T and the top surface of the portion 302II in accordance with an embodiment.

Figure 13:
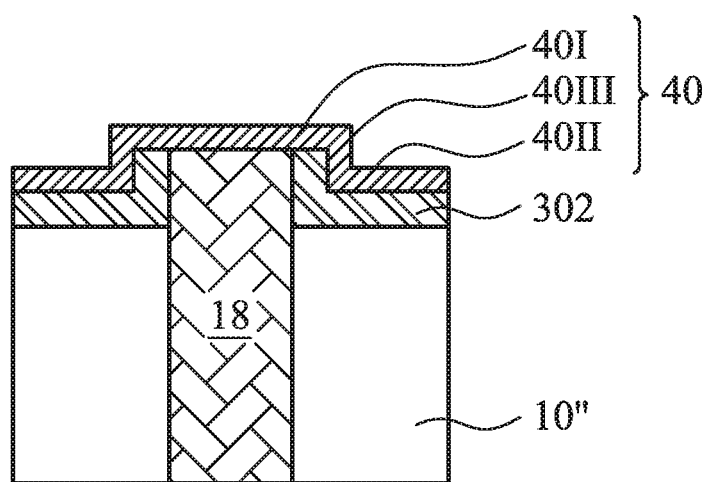

Referring now to FIG. 13, a conductive layer 40 is deposited over the isolation film 302 and the TSV structure 18. In an embodiment, the conductive layer 40 is formed by depositing a conformal conductive layer, such as a layer of Al, an Al alloy, W, Cu, Ti, Ta, TiN, TaN, or the like, using CVD or PVD techniques. When the conductive layer 40 is deposited, it replicates the topography of the underlying feature, and thereby the conductive layer 40 includes a first portion 40I on the top surface 18T of the TSV structure 18, a second portion 40II on the second portion 302II of the isolation film 302, and a third portion 40III along the first portion 302I of the isolation film 302. There is a step height between the first portion 40I and the second portion 40II in accordance with an embodiment. For example, the distance between the top surface of the first portion 40I and the top surface of the second portion 40II is in the range of about 1000 Å to about 2 μm.

Figure 14:
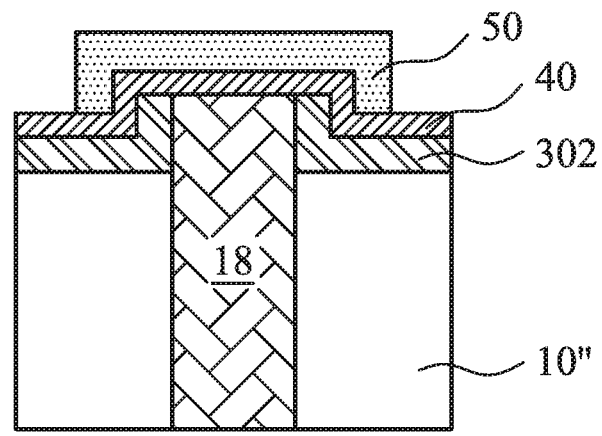

FIG. 14 illustrates a patterned mask 50 formed over the conductive layer 40 in accordance with an embodiment. The patterned mask 50 defines portions of the conductive layer 40 that will act as conductive pads and/or redistribution lines. The patterned mask 50 may be a patterned photoresist mask, hard mask, a combination thereof, or the like. In an embodiment, a photoresist material is deposited on the conductive layer 40 and patterned using photolithographic techniques. By using the convex portion 18B of the TSV structure 18 as an alignment target, returned signals reflected from the first portion 40I and the second portion 40II are read and detected, and the step height is easily aligned by lithographic tools such that the photoresist material can be patterned and located accurately in the photolithography process.

Figure 15:
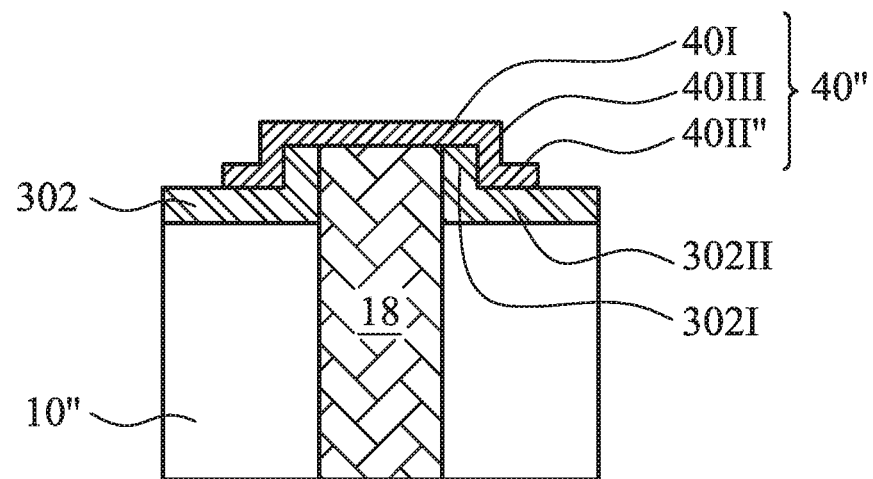

Thereafter, as shown in FIG. 15, an etch process is performed to pattern the conductive layer 40 to form conductive elements 40" that act as the conductive pads and/or redistribution lines. After the etch process, the patterned mask 50 may be stripped. In an embodiment, the conductive element 40" physically contacts and electrically connects the TSV structure 18 and includes the first portion 40I located above the convex portion 18B of the TSV structure 18. In some embodiments, the conductive element 40" also includes the third portion 40III that extends from the first portion 40I and physically contacts the isolation film 302 along the sidewall 18S of the convex portion 18B. In some embodiments, the conductive element 40" also includes the patterned second portion 40II" that extends from the third portion 40III and physically contacts part of the portion 302II. The conductive element 40" may act as a redistribution layer to provide an electrical connection to the TSV structure 18 and to provide redistribution lines. The conductive element 40" may act as a redistribution line which allows an electrical connection to another device, such as a die, wafer, packaging substrate, or the like, at a location other than the location of the TSV structure 18. This allows for greater flexibility and a higher degree of independence regarding the placement of the TSV structures 18, the electrical circuitry on the substrate, and the pin-out locations.

Figure 16:
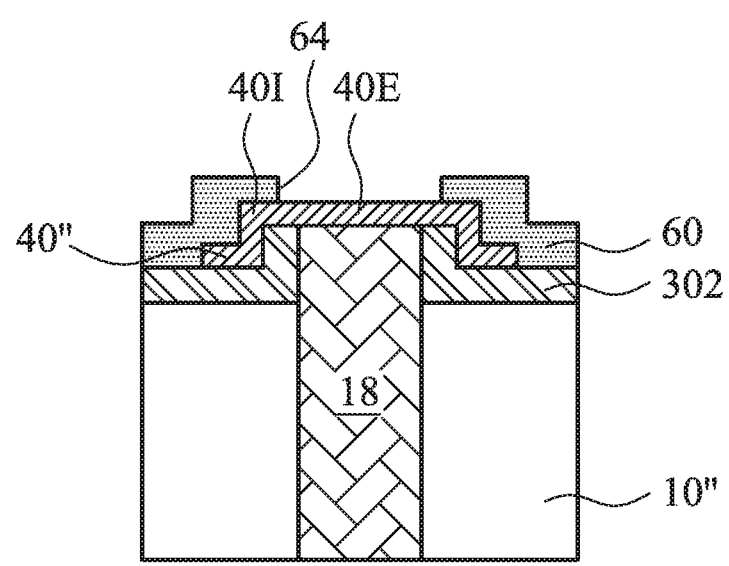

FIG. 16 illustrates a patterned passivation layer 60 formed over the conductive element 40" and the isolation film 30 and having an opening 64 exposing a portion 40E of the conductive element 40". In accordance with an embodiment, the exposed portion 40E is within the first portion 40I, for example located above the convex portion 18B. A connection element can be formed on the exposed portion 40E in accordance with an embodiment. The connection element may be any suitable conductive material, such as Cu, Ni, Sn, Au, Ag, solder or the like, and may be formed by any suitable method, including evaporation, electroplating, printing, jetting, stud bumping, direct placement, wire bonding or the like. Thereafter, other back-end-of-line processing techniques suitable for the particular application may be performed. For example, the carrier substrate 28 may be removed, an encapsulant may be formed, a singulation process may be performed to singulate individual dies, wafer-level or die-level stacking, and the like, may be performed. It should be noted, however, that embodiments may be used in many different situations. For example, embodiments may be used in a die-to-die bonding configuration, a die-to-wafer bonding configuration, or a wafer-to-wafer bonding configuration.

According to some embodiments, a semiconductor device includes a semiconductor substrate and a through-substrate via extending from a frontside to a backside of the semiconductor substrate. The through-substrate via includes a concave surface adjacent to the backside of the semiconductor substrate. An isolation film is formed on the backside of the semiconductor substrate without covering the concave surface of the through-substrate via. A conductive layer includes a first portion which is a concave portion formed on the concave surface of the through substrate via and a second portion formed on the isolation film. A passivation layer partially covers the conductive layer.

According to some embodiments, a semiconductor device includes a semiconductor substrate and a through-substrate via extending from a frontside to a backside of the semiconductor substrate. The through-substrate via includes a convex portion protruding from the backside of the semiconductor substrate. An isolation film includes a first portion formed on a sidewall of the convex portion of the through-substrate via and a second portion formed on the backside of the semiconductor substrate. A conductive layer includes a first portion formed on a top of the convex portion of the through-substrate via and a second portion formed on the second portion of the isolation film. A passivation layer partially covers the conductive layer.

According to some embodiments, a semiconductor device includes a through-substrate via extending from a first surface to a second surface of a substrate, the second surface being opposite the first surface. A first end of the through-substrate via extends above the second surface of the substrate. An isolation film includes a first portion formed on sidewalls of the first end of the through-substrate via and a second portion formed on the second surface of the substrate. A conductive layer includes a first portion formed on a topmost surface of the first end of the through-substrate via, a second portion formed on the first portion of the isolation film, and a third portion formed on the second portion of the isolation film.

According to some embodiments, a method of forming a semiconductor device includes forming a through-substrate via in a substrate, thinning a backside of the substrate to expose a first end of the through-substrate via, the first end having a convex shape protruding from the backside of the substrate, and forming an isolation film over the backside of the substrate and the first end of the through-substrate via. The method further includes removing the isolation film from a topmost surface of the first end of the through-substrate via, depositing a conductive layer on the isolation film and the topmost surface of the first end of the through-substrate via, and patterning the conductive layer.

One general aspect of embodiments disclosed herein includes a method of forming a semiconductor device, the method including forming a through-substrate via in a substrate and thinning a backside of the substrate to expose a first end of the through-substrate via. The first end has a convex shape protruding from the backside of the substrate. The method further includes forming an isolation film over the backside of the substrate and the first end of the through-substrate via, and removing the isolation film from a topmost surface of the first end of the through-substrate via. The method further includes depositing a conductive layer on the isolation film and the topmost surface of the first end of the through-substrate via, and patterning the conductive layer.

Another general aspect of embodiments disclosed herein includes a method of forming a semiconductor device, the method including forming on a frontside of a semiconductor substrate a transistor and forming a conductor extending from the frontside of the substrate into the substrate. The method further includes recessing a backside of the substrate to expose an end of the conductor, and conformally depositing a dielectric film over sidewalls and a top surface of the end of the conductor, then removing the dielectric film from the top surface of the end of the conductor, while the dielectric film remains covering the sidewalls of the end of the conductor. The method further includes depositing a conductive layer over the dielectric film and electrically contacting the top surface of the end of the conductor; and patterning the conductive layer.

Yet another general aspect of embodiments disclosed herein includes a method of forming a semiconductor device, the method including forming a continuous homogenous conductor extending into a semiconductor substrate, and recessing a surface of the semiconductor substrate to expose an end of the conductor. The method further includes covering sidewalls of the end of the conductor with an isolation film while leaving a top surface of the end of the conductor uncovered, covering with a conductive layer the isolation film and the top surface of the end of the conductor, and patterning the conductive layer. The method yet further includes forming a patterned passivation layer over the patterned conductive layer, the patterned passivation layer covering sidewalls of the patterned conductive layer and leaving uncovered a central portion of the patterned conductive layer.

While the present disclosure has been particularly shown and described with reference to example embodiments thereof, a skilled person in the art will appreciate that there can be many embodiment variations of this disclosure. Although the embodiments and their features have been described in detail, it should be understood that various changes, substitutions, and alterations can be made herein without departing from the spirit and scope of the embodiments.

The above method embodiments show exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:

1. A method of forming a semiconductor device, the method comprising:
    forming a through-substrate via in a substrate;
    thinning a backside of the substrate to expose a first end of the through-substrate via, the first end having a convex shape protruding from the backside of the substrate;
    forming an isolation film over the backside of the substrate and the first end of the through-substrate via;
    removing the isolation film from a topmost surface of the first end of the through-substrate via;
    depositing a conductive layer on the isolation film and the topmost surface of the first end of the through-substrate via;
    patterning the conductive layer; and
    conformally depositing a passivation layer over the conductive layer, and patterning the passivation layer, the patterned passivation layer exposing a portion of the conductive layer over the through-substrate via.

2. The method of claim 1, wherein the step of patterning the conductive layer further comprises:
    forming a patterned mask on the conductive layer;
    etching the conductive layer; and
    removing the patterned mask, wherein the patterned conductive layer includes a first portion extending along a top of the through-substrate via, a second portion extending parallel to sidewalls of the through-substrate via, and a third portion and having an elongated axis extending away from the second portion.

3. The method of claim 1, wherein the step of thinning a backside of the substrate to expose a first end of the through-substrate via includes:
    planarizing the backside of the substrate to expose the through-substrate via using a chemical mechanical polishing process; and
    recessing the planarized backside of the substrate using a selective etch process, the selective etch process being selective to the substrate relative to the through-substrate via.

4. The method of claim 1, wherein the step of forming an isolation film over the backside of the substrate and the first end of the through-substrate via includes conformally forming the isolation film over the through-substrate via.

5. The method of claim 1, wherein after the step of removing the isolation film from a topmost surface of the first end of the through-substrate via, the topmost surface of the first end of the through-substrate via extends a step height above the topmost portion of the topmost surface of the isolation film extending over the backside of the substrate.

6. The method of claim 1, wherein the thinning includes performing a first process having a mechanical removal aspect followed by a second process involving a wet etch or a dry etch.

7. A method of forming a semiconductor device, the method comprising:
    forming on a frontside of a semiconductor substrate a transistor;
    forming a conductor extending from the frontside of the substrate into the substrate;
    recessing a backside of the substrate to expose an end of the conductor;
    conformally depositing a dielectric film over sidewalls and a top surface of the end of the conductor;
    removing the dielectric film from the top surface of the end of the conductor, while the dielectric film remains covering the sidewalls of the end of the conductor;
    depositing a conductive layer over the dielectric film and electrically contacting the top surface of the end of the conductor;
    patterning the conductive layer to form a redistribution line having a first portion extending substantially parallel to the backside of the substrate, a second portion extending substantially perpendicular to the backside of the substrate and contacting sidewalls of the dielectric film, and a third portion extending away from the second portion and extending substantially parallel to the backside of the substrate;
    conformally depositing a passivation layer over the patterned conductive layer; and
    patterning the passivation layer to expose a portion of the patterned conductive layer.

8. The method of claim 7, further comprising electrically contacting the transistor and the conductor.

9. The method of claim 7, wherein the step of recessing a backside of the substrate to expose an end of the conductor includes planarizing the backside of the substrate with a chemical mechanical process and then selectively etching the planarized backside of the substrate using an etch process separate from the chemical mechanical process.

10. The method of claim 7, wherein the step of removing the dielectric film from the top surface of the end of the conductor includes a step of etching, grinding, or chemical-mechanical polishing.

11. The method of claim 10, wherein the step of removing the dielectric film from the top surface of the end of the conductor forms a step between the top surface of the end of the conductor and a top surface of a remaining portion of the dielectric film.

12. The method of claim 7, wherein the step of depositing a conductive layer over the dielectric film and electrically contacting the top surface of the end of the conductor includes depositing a conformal metallic layer.

13. The method of claim 7, wherein the step of patterning the conductive layer further comprises:
    forming a patterned mask on the conductive layer;
    etching the conductive layer to form a redistribution line; and
    removing the patterned mask.

14. A method of forming a semiconductor device, the method comprising:
    forming a continuous homogenous conductor extending into a semiconductor substrate;
    recessing a surface of the semiconductor substrate to expose an end of the conductor;
    covering sidewalls of the end of the conductor with an isolation film while leaving a top surface of the end of the conductor uncovered;
    covering with a conductive layer the isolation film and the top surface of the end of the conductor;
    patterning the conductive layer; and
    conformally depositing a passivation layer over the patterned conductive layer; and
    patterning the passivation layer to cover sidewalls of the patterned conductive layer while leaving uncovered a central portion of the patterned conductive layer.

15. The method of claim 14, wherein the step of forming a patterned passivation layer over the patterned conductive layer includes patterning the passivation layer so that a region of the patterned conductive layer aligned with the end of the conductor is free from the patterned passivation layer.

16. The method of claim 14, wherein the step of covering sidewalls of the end of the conductor with an isolation film while leaving a top surface of the end of the conductor uncovered includes covering the sidewalls and the top surface of the end of the conductor and then removing the isolation film from the top surface of the end of the conductor.

17. The method of claim 14, wherein the step of patterning the conductive layer further comprises:
    forming a redistribution line having a first portion extending substantially parallel to the surface of the substrate, a second portion extending substantially perpendicular to the surface of the substrate and contacting sidewalls of the isolation film, and a third portion extending away from the second portion and extending substantially parallel to the surface of the substrate, by:
    forming a patterned mask on the conductive layer;
    etching the conductive layer; and
    removing the patterned mask.

18. The method of claim 14, further comprising forming a solder connection element physically contacting the uncovered central portion of the patterned conductive layer.

19. The method of claim 14, wherein the step of recessing a surface of the semiconductor substrate to expose an end of the conductor, further comprises:
    chemical mechanical polishing the surface of the substrate to expose the conductor; and subsequently
    recessing the surface of the substrate using a selective etch process, the selective etch process being selective to the substrate relative to the conductor.

* * * * *